United States Patent
Kato et al.

(10) Patent No.: US 6,923,678 B2
(45) Date of Patent: Aug. 2, 2005

(54) DEVICE FOR TEMPORARILY FASTENING ELECTRONIC COMPONENT TO CIRCUIT BOARD

(75) Inventors: Yoshiaki Kato, Aichi (JP); Tetsuya Hattori, Aichi (JP); Keiichi Ito, Aichi-ken (JP); Masato Minakata, Toyota (JP); Atsushi Nishida, Toyota (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 27 days.

(21) Appl. No.: 10/606,871

(22) Filed: Jun. 26, 2003

(65) Prior Publication Data
US 2004/0053529 A1 Mar. 18, 2004

(30) Foreign Application Priority Data
Jul. 1, 2002 (JP) ........................................ 2002-192352

(51) Int. Cl.⁷ .............................................. H01R 13/60
(52) U.S. Cl. ........................................ 439/567; 439/571
(58) Field of Search ............................ 439/567, 79–82, 439/607, 571–572, 381, 374, 378

(56) References Cited

U.S. PATENT DOCUMENTS

| | | | |
|---|---|---|---|
| 4,655,537 A | 4/1987 | Andrews, Jr. | |
| 4,842,552 A | 6/1989 | Frantz | |
| 5,145,407 A | * 9/1992 | Obata et al. | ......... 439/567 |
| 5,169,333 A | 12/1992 | Yang Lee | |
| 5,316,500 A | 5/1994 | Vanaleck et al. | |
| 5,340,321 A | * 8/1994 | Hashiguchi et al. | ......... 439/108 |
| 5,468,154 A | * 11/1995 | Yip et al. | ......... 439/79 |
| 5,632,649 A | * 5/1997 | Spangler | ......... 439/567 |
| 5,827,089 A | * 10/1998 | Beck, Jr. | ......... 439/567 |
| 5,971,803 A | * 10/1999 | McHugh et al. | ......... 439/567 |
| 6,364,700 B1 | 4/2002 | Zhu et al. | |

FOREIGN PATENT DOCUMENTS

EP      0 422 744 A1    4/1991

* cited by examiner

Primary Examiner—Gary Paumen
Assistant Examiner—Edwin A. Leon
(74) Attorney, Agent, or Firm—Crompton, Seager & Tufte, LLC

(57) ABSTRACT

A fastening device for facilitating temporary fastening of an electronic component to a circuit board. The fastening device includes a base embedded in an electronic device and two elastic plates extending from the base. Each elastic plate includes a diagonal portion, which extend diagonally relative to the plane of the circuit board, and a leg, which extends continuously from the diagonal portion. When the legs are inserted through a connecting hole of the circuit board, the resilient force of the elastic plates presses the diagonal portions against the wall of the connecting hole.

15 Claims, 5 Drawing Sheets

DEVICE FOR TEMPORARILY FASTENING ELECTRONIC COMPONENT TO CIRCUIT BOARD

BACKGROUND OF THE INVENTION

The present invention relates to a device for temporarily fastening electronic components, such as a connector, to a circuit board.

Figure 8:
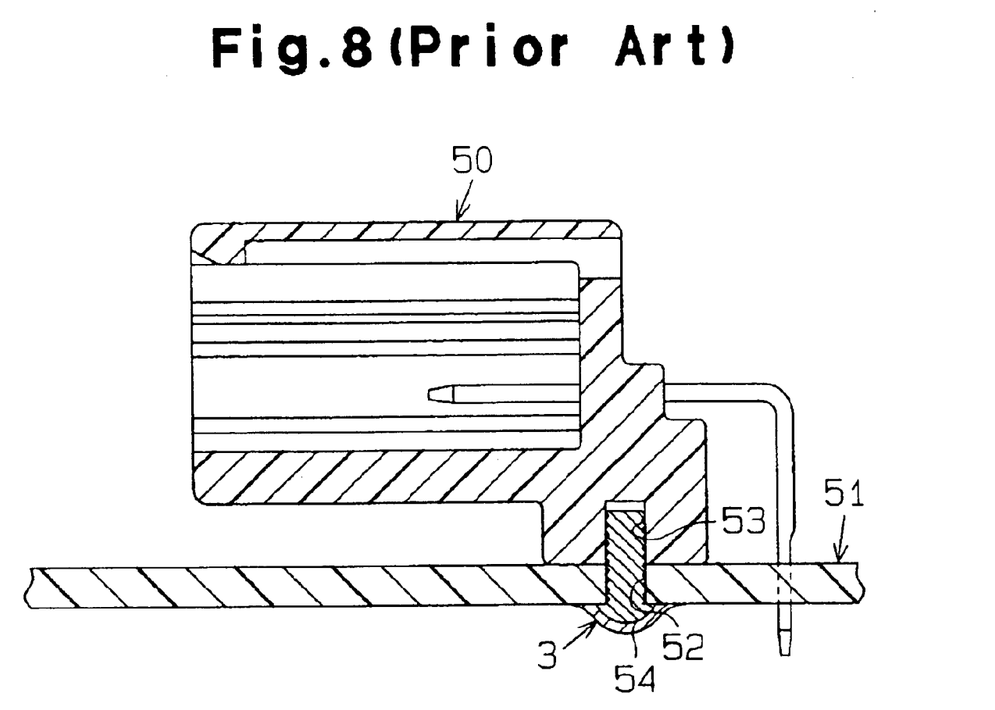
FIG. 8 is a cross-sectional view showing how an electronic component is temporarily fastened to a printed circuit board in the prior art.

In the prior art, an electronic component, such as a connector, is temporarily fastened to a circuit board, such as a printed circuit board, at a predetermined connecting position before being securely fastened to the circuit board. As shown in FIG. 8, a threaded hole 53 is formed in the lower portion of an electronic component 50. A printed circuit board 51 has a connecting hole 52 at a position where the electronic component 50 is connected to the circuit board 51. To temporarily fasten the electronic component 50 to the circuit board 51, the electronic component 50 is first arranged at the connecting position. Then, a fastener 54, such as a screw, temporarily fastens the electronic component 50 to the printed circuit board 51 from the lower side of the circuit board 51. Subsequently, the electronic component 50 is soldered to the printed circuit board 51 from the lower side of the circuit board 51. Thus, the electronic component 50 is securely fastened to the printed circuit board 51 by solder 3.

However, in the prior art, to connect the electronic component 50 to the printed circuit board 51, a person must arrange the electronic component 50 on the printed circuit board 51 at the connecting position, reverse the circuit board 51, and connect the electronic component 50 to the printed circuit board 51 with the fastener 54. This increases the number of operations for connecting the electronic component 50 to the printed circuit board 51 and lowers working efficiency.

SUMMARY OF THE INVENTION

It is an object of the present invention to provide a device for facilitating temporary fastening of an electronic component to a printed circuit board.

To achieve the above object, the present invention provides a fastening device for temporarily fastening an electronic component to a circuit board. The circuit board has a connecting hole. The fastening device includes a base and at least two elastic plates formed integrally with the base and received in the connecting hole. The elastic plates each include a first portion, which is arranged outside a wall defining the connecting hole when the at least two elastic plates are received in the connecting hole, and a second portion, which extends diagonally relative to a plane of the circuit board when the at least two elastic plates are received in the connecting hole. The second portion has a section pressed against the wall of the connecting hole by the elastic force of the at least two elastic plates.

Another aspect of the present invention is an electronic component connected to a circuit board. The circuit board has a connecting hole. The electronic component includes a fastening portion for contacting a plane of the circuit board and a fastening device arranged in the fastening portion. The fastening device includes a base and at least two elastic plates formed integrally with the base and received in the connecting hole. The elastic plates each including a first portion, which is arranged outside a wall defining the connecting hole when the at least two elastic plates are received in the connecting hole, and a second portion, which extends diagonally relative to the plane of the circuit board when the at least two elastic plates are received in the connecting hole. The second portion has a section pressed against the wall of the connecting hole by the elastic force of the at least two elastic plates.

A further aspect of the present invention is a structure for fastening an electronic component to a circuit board. The circuit board has a connecting hole. The structure includes a fastening portion defined in the electronic component to contact a plane of the circuit board. A fastening device is attached to the fastening portion to temporarily fasten the electronic component to the circuit board. Solder securely fastens the temporarily fastened electronic device. The fastening device includes a base located in the fastening portion. At least two elastic plates are formed integrally with the base and received in the connecting hole. The elastic plates each include a first portion, which is arranged outside a wall defining the connecting hole when the at least two elastic plates are received in the connecting hole, and a second portion, which extends diagonally relative to the plane of the circuit board when the at least two elastic plates are received in the connecting hole. The second portion has a section pressed against the wall of the connecting hole by the elastic force of the at least two elastic plates.

A further aspect of the present invention is a method for manufacturing a fastening device that temporarily fastens an electronic component to a circuit board. The method includes forming a punched product including a base formed integrally with two elastic plates, which extend from opposite sides of the base, by punching the base and elastic plates out from a metal sheet, and bending the punched product so that the two elastic plates intersect each other at the center of the fastening device.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A preferred embodiment of the present invention will now be discussed.

Figure 1:
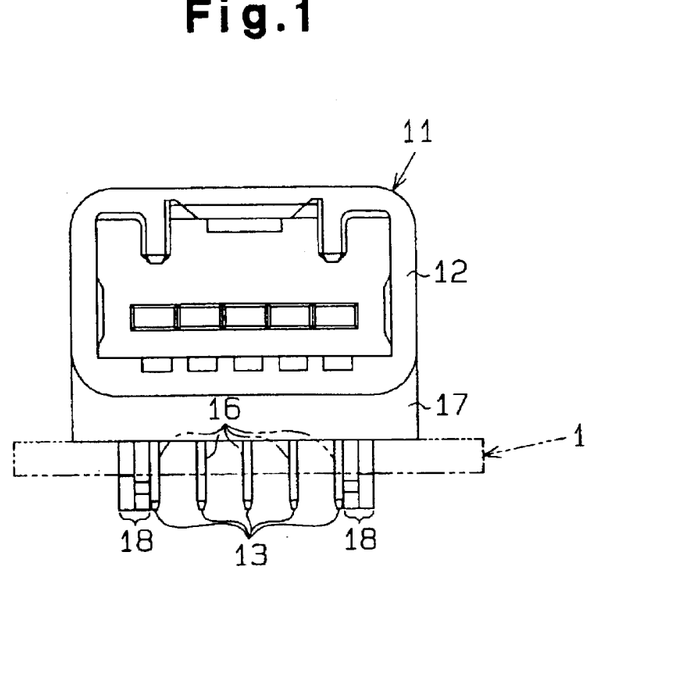
FIG. 1 is a front view of a connector incorporating a fastening device according to a preferred embodiment of the present invention.
Figure 2:
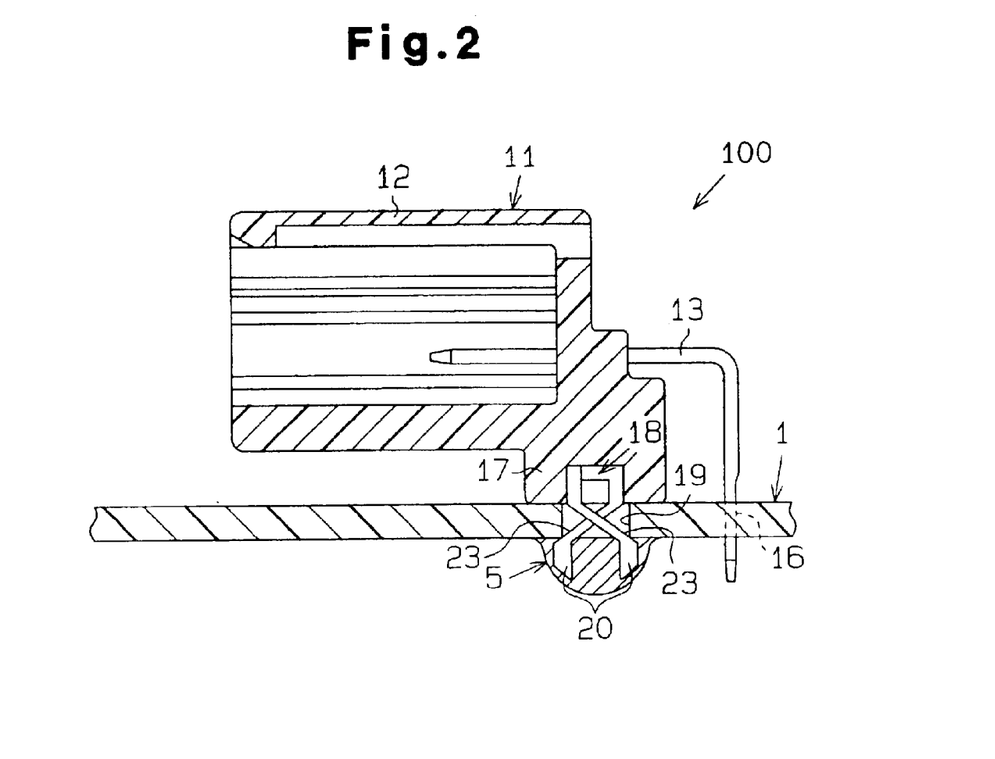
FIG. 2 is a cross-sectional view showing the connector of FIG. 1 in a state fastened to a circuit board.

Referring to FIGS. 1 and 2, an electronic component, or a connector 11, which is connected to a circuit board 1, such as a printed circuit board, includes a housing 12, and terminals 13, which are accommodated in the housing 12. The terminals 13 are bent at a right angle and inserted in terminal holes 16, which extend through the circuit board 1. A fastening portion 17, which is fastened to the circuit board 1, is defined at the lower part of the housing 12.

At least one metal fastening device 18 is attached to the fastening portion 17 of the connector 11 to temporarily fasten the connector 11 to the circuit board 1. As shown in FIG. 2, it is preferred that two fastening devices 18 be attached to the fastening portion 17 separated from each other by a predetermined distance and that the fastening devices 18 be attached near the ends of the fastening portion 17. However, three or more fastening devices 18 may be attached to the connector 11.

Figure 3:
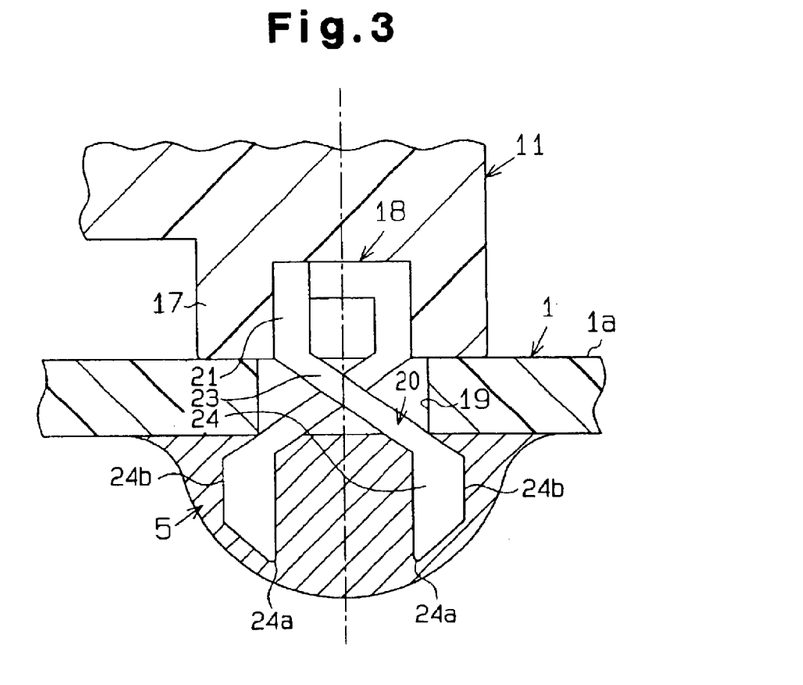
FIG. 3 is an enlarged view of FIG. 2 showing the fastening device.

Referring to FIG. 3, each fastening device 18 has two elastic plates 20. At least one connecting hole 19 used to connect the connector 11 to the circuit board 1 is provided on the circuit board 1 at a predetermined location. The number of connecting holes 19 is determined in accordance with the number of fastening devices 18. The two elastic plates 20 are inserted into a connecting hole 19 from the upper surface, or connecting plane 1a, of the circuit board 1 to temporarily fasten the connector 11 to the circuit board 1. After temporarily fastening the connector 11, the lower surface of the circuit board 1, especially, legs 24 extending from the elastic plates 20, undergo flow soldering. This fastens the fastening device 18 to the circuit board 1 with solder 5 and manufactures a unit, or board 100, which includes the circuit board 1 and the connector 11.

Figure 4A:
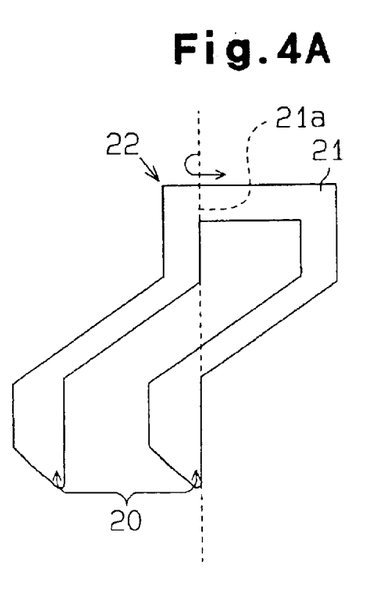
FIGS. 4A and 4B are diagrams illustrating the procedure for manufacturing the fastening device.
Figure 4B:
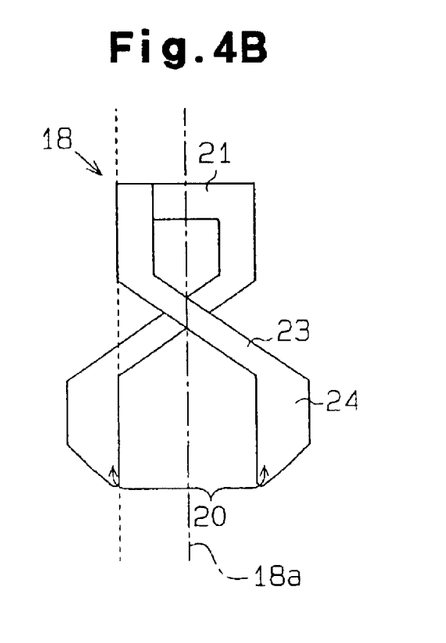

Each fastening device 18 includes a base 21, which is embedded in the fastening portion 17 of the connector 11. The two elastic plates 20 extend from the base 21. The base 21 and the two elastic plates 20 are punched out of a sheet of metal with a pressing machine, or the like. For example, referring to FIG. 4A, a punched product 22 integrally including the base 21 and the two elastic plates 20 is first punched out of a metal sheet. Then, one of the elastic plates 20 is folded along a folding line 21a, which is defined in the base 21, so that the elastic plates 20 intersect each other at the center axis 18a of the fastening device 18, as shown in FIG. 4B. The fastening device 18 is manufactured in this manner.

As shown in FIGS. 3 and 4B, each elastic plate 20 includes a diagonal portion 23 extending diagonally between the base 21 and the corresponding leg 24. When the fastening device 18 is temporarily fastened in the connecting hole 19, the resilient force of the elastic plates 20 press the diagonal portions 23 against the wall of the connecting hole 19. The engagement between part of the elastic plates 20 and the wall of the connecting hole 19 temporarily fastens the connector 11 at its predetermined connecting position.

The portion of each leg 24 continuously extending from the corresponding diagonal portion 23 is slightly wider than the diagonal portion 23. Further, each leg 24 becomes narrower at portions closer to its distal end 24a. When the fastening device 18 is free from deformation, it is preferred that the distance between the distal ends 24a of the two elastic plates 20 be smaller than the diameter of the connecting hole 19 and that the distance between the outer side surfaces 24b of the two legs 24 be greater than the diameter of the connecting hole 19. The tapered shape of each leg 24 facilitates insertion of the fastening device 18 into each connecting hole 19.

The procedures for temporarily fastening the connector 11 incorporating the fastening device 18 will now be discussed.

Figure 5A:
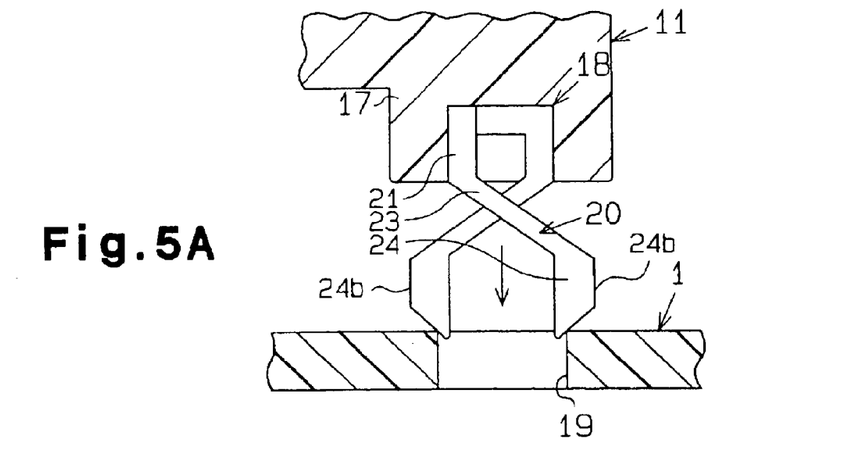
FIGS. 5A, 5B, and 5C are diagrams illustrating the deformation of the fastening device when temporarily fastening the connector to the printed circuit board.
Figure 5B:
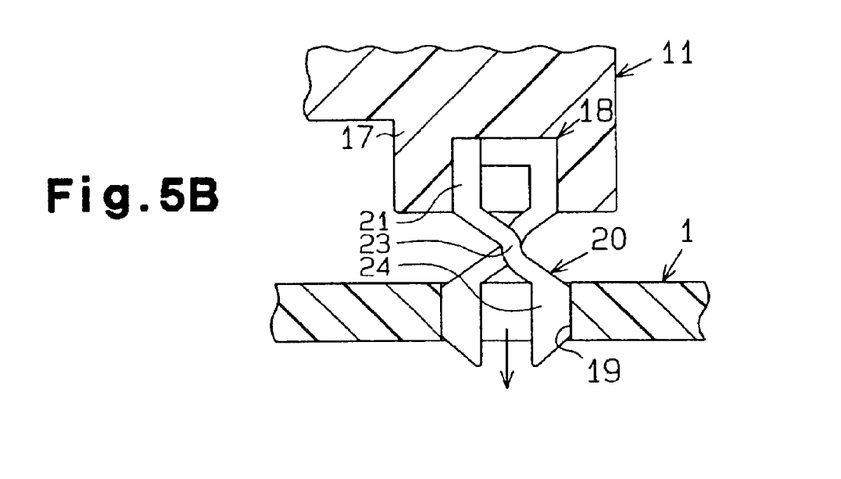
Figure 5C:
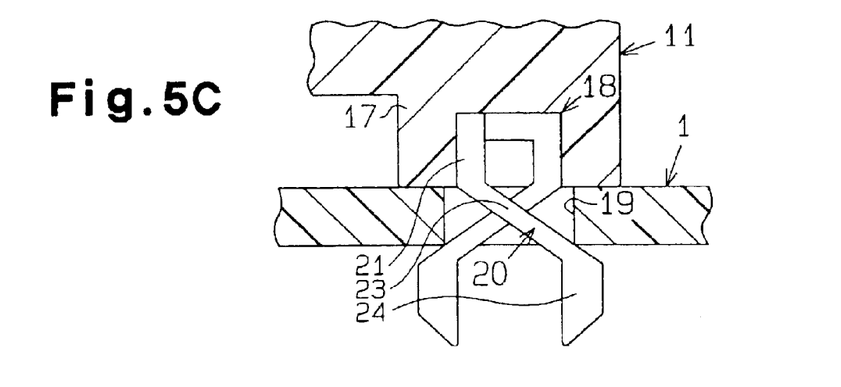

Referring to FIG. 5A, the connector 11 is first arranged at its connecting position on the circuit board 1 and moved toward the connecting hole 19. Referring to FIG. 5B, when the fastening device 18 is inserted into the connecting hole 19, the elastic plates 20 are elastically deformed so that the two legs 24 move toward each other. Further advancement of the connector 11 toward the connecting hole 19 guides the outer side surfaces 24b of the two legs 24 along the wall of the connecting hole 19. Referring to FIG. 5C, when the legs 24 move out of the connecting hole 19, the resilience of the elastic plates 20 moves the two legs 24 outward from the wall of the connecting hole 19 and presses the two diagonal portions 23 against the wall of the connecting hole 19. As a result, the circuit board 1 is held between the fastening portion 17 of the connector 11 and the two diagonal portions 23. This temporarily fastens the connector 11 to the circuit board 1.

The preferred embodiment has the advantages described below.

The two elastic plates 20 are inserted into the connecting hole 19 of the circuit board 1 as the elastic plates 20 elastically deform about their basal ends. Upon completion of the insertion, the legs 24 of the elastic plates 20 move outward from the wall of the connecting hole 19, and the elastic force of the elastic plates 20 press the diagonal portions 23 against the wall of the connecting hole 19. Accordingly, the connector 11 incorporating the fastening device 18 is easily temporarily fastened to the circuit board 1. The fastening device 18 is especially convenient in that it completes the temporary fastening of the connector 11 to the circuit board 1 with only one action.

The diagonal portions 23 of the elastic plates 20 enable application of the fastening device 18 when temporarily fastening the connector 11 to various types of circuit boards having different thicknesses. In other words, the connector 11, which incorporates the fastening device 18, may be applied for various types of circuit boards having different widths. This widens the application of the connector 11.

Each elastic plate 20 is formed so that it becomes narrower at portions closer to its distal end 24a. This facilitates the insertion of the fastening device 18 into the connecting hole 19. Accordingly, the connector 11 incorporating the fastening device 18 is temporarily fastened to the circuit board 1 in a simple manner.

The fastening device 18 is manufactured by punching out the punched product 22, which integrally includes the base 21 and the two elastic plates 20, and bending the punched product 22. The simplified manufacturing of the fastening device 18 increases the yield of the fastening device 18.

The structure of the fastening device 18 is extremely simple, and the metal sheet is used efficiently when punching out the punched product 22. Since the elastic plates 20 extend parallel to each other, many punched products 22 may be manufactured from a single sheet of metal. Accordingly, the fastening device 18 is manufactured at a low cost.

The two elastic plates 20 extend from the base 21 and intersect each other or overlap at the center axis 18a of the fastening device. Accordingly, after insertion of the fastening device 18 into the connecting hole 19, the diagonal portions 23 of the two elastic plates 20 are pressed against the wall of the connecting hole 19 by equal forces. This temporarily fastens the connector 11, which incorporates the fastening device 18, to the circuit board 1 in a stable manner.

It should be apparent to those skilled in the art that the present invention may be embodied in many other specific forms without departing from the spirit or scope of the invention. Particularly, it should be understood that the present invention may be embodied in the following forms.

The fastening device 18 of the preferred embodiment is manufactured by punching out the punched product 22, which integrally includes the base 21 and the two elastic plates 20, from a metal sheet and bending the punched product 22 to the predetermined shape. However, the fastening device 18 does not have to be manufactured in such a manner. For example, the fastening device 18 may be modified to fastening devices 47 and 57 shown respectively in FIGS. 6 and 7.

Figure 6:
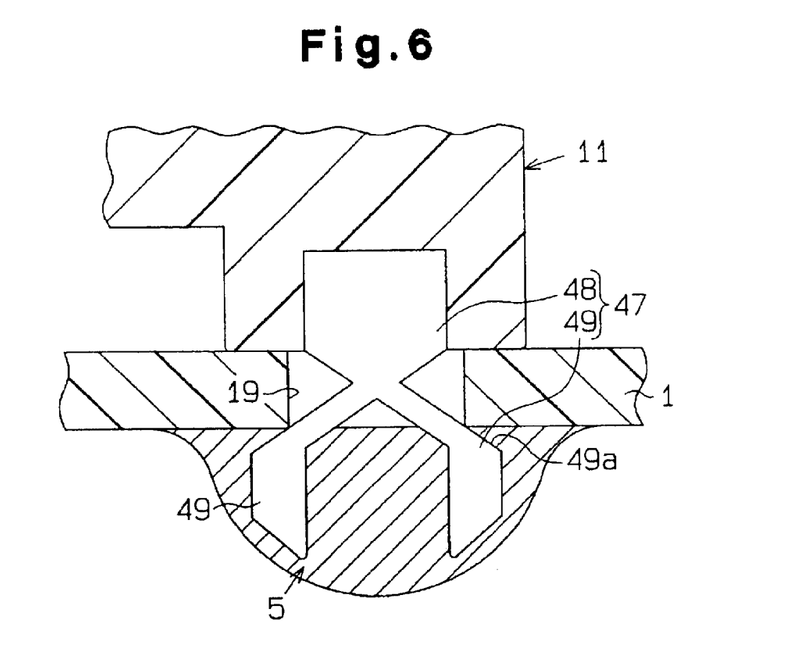
FIG. 6 is an enlarged view showing a first modification of the fastening device.
Figure 7:
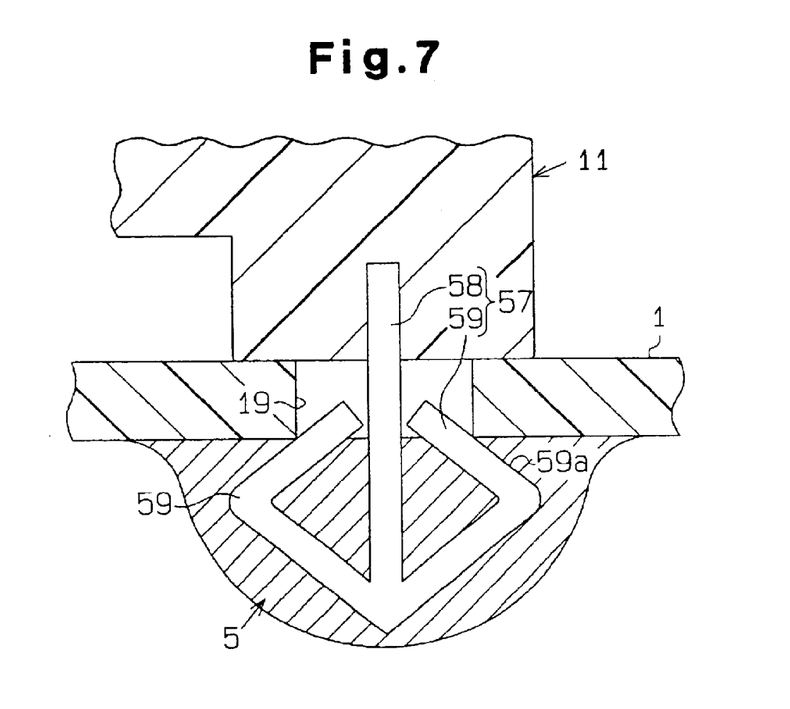
FIG. 7 is an enlarged view showing a second modification of the fastening device.

In the modification of FIG. 6, the fastening device 47 includes a pentagonal base 48 and two elastic plates 49, which extend away from each other from the lower end of the base 48. In the modification of FIG. 7, the fastening device 57 includes an elongated base 58 and two bent elastic plates 59, which extend away from each other from the lower end of the base 58. The elastic plates 49 and 59 of the fastening devices 47 and 57 respectively include diagonal portions 49a and 59a. The elastic forces of the elastic plates 49 and 59 press the diagonal portions 49a and 59a against the wall of the connecting hole 19 in the circuit board 1.

The fastening device 18 may be incorporated in electronic components other than the connector 11. Further, the fastening device 18 may be used to fasten components other than electronic components.

The present examples and embodiments are to be considered as illustrative and not restrictive, and the invention is not to be limited to the details given herein, but may be modified within the scope and equivalence of the appended claims.

What is claimed is:

1. A fastening device for temporarily fastening an electronic component to a circuit board, wherein the circuit board has a connecting hole, the fastening device comprising:
    a base; and
    at least two elastic plates formed integrally with the base and received in the connecting hole, the elastic plates each including a first portion, which is arranged outside a wall defining the connecting hole when the at least two elastic plates are received in the connecting hole, and a second portion, which extends diagonally relative to a plane of the circuit board when the at least two elastic plates are received in the connecting hole, the second portion having a section pressed against the wall of the connecting hole by the elastic force of the at least two elastic plates;
    wherein the base and the at least two elastic plates lie at least substantially on a flat plane wherein the second portion of the at least two elastic plates intersect in the form of an 'X' at the center of the fastening device.

2. The fastening device according to claim 1, wherein the base and the at least two elastic plates are made of metal, and the at least two elastic plates intersect each other.

3. The fastening device according to claim 1, wherein the at least two elastic plates intersect each other at the center of the fastening device.

4. The fastening device according to claim 1, wherein the first portion includes a leg defined at a distal portion of the associated elastic plate, the leg becoming narrower toward its end.

5. The fastening device according to claim 4, wherein when the at least two elastic plates are free from deformation, the distance between distal ends of the elastic plates is smaller than the diameter of the connecting hole.

6. An electronic component connected to a circuit board, wherein the circuit board has a connecting hole, the electronic component comprising:
    a fastening portion for contacting a plane of the circuit board; and
    a fastening device arranged in the fastening portion, the fastening device including:
        a base; and
        at least two elastic plates formed integrally with the base and received in the connecting hole, the elastic plates each including a first portion, which is arranged outside a wall defining the connecting hole when the at least two elastic plates are received in the connecting hole, and a second portion, which extends diagonally relative to the plane of the circuit board when the at least two elastic plates are received in the connecting hole, the second portion having a section pressed against the wall of the connecting hole by the elastic force of the at least two elastic plates;
        wherein the base and the at least two elastic plates lie at least substantially on a flat plane wherein the second portion of the at least two elastic plates intersect in the form of an 'X' at the center of the fastening device.

7. The electronic component according to claim 6, wherein the base and the at least two elastic plates are made of metal, and the at least two elastic plates intersect each other.

8. The electronic component according to claim 6, wherein the at least two elastic plates intersect each other at the center of the fastening device.

9. The electronic component according to claim 6, wherein the first portion includes a leg defined at a distal portion of the associated elastic plate, the leg becoming narrower toward its end.

10. The electronic component according to claim 9, wherein when the at least two elastic plates are free from deformation, the distance between distal ends of the elastic plates is smaller than the diameter of the connecting hole.

11. A structure for fastening an electronic component to a circuit board, wherein the circuit board has a connecting hole, the structure comprising:
    a fastening portion defined in the electronic component to contact a plane of the circuit board;
    a fastening device attached to the fastening portion to temporarily fasten the electronic component to the circuit board; and
    solder for securely fastening the temporarily fastened electronic device, wherein the fastening device includes:
        a base located in the fastening portion; and
        at least two elastic plates formed integrally with the base and received in the connecting hole, wherein the elastic plates each include a first portion, which is arranged outside a wall defining the connecting hole when the at least two elastic plates are received in the connecting hole, and a second portion, which extends diagonally relative to the plane of the circuit board when the at least two elastic plates are received in the connecting hole, the second portion having a section pressed against the wall of the connecting hole by the elastic force of the at least two elastic plates;

wherein the base and the at least two elastic plates lie at least substantially on a flat plane wherein the second portion of the at least two elastic plates intersect in the form of an 'X' at the center of the fastening device.

12. The structure according to claim 11, wherein the base and the at least two elastic plates are made of metal, and the at least two elastic plates intersect each other.

13. The structure according to claim 14, wherein the at least two elastic plates intersect each other at the center of the fastening device.

14. The structure according to claim 11, wherein the first portion includes a leg defined at a distal portion of the associated elastic plate, the leg becoming narrower toward its end.

15. The structure according to claim 14, wherein when the at least two elastic plates are free from deformation, the distance between distal ends of the elastic plates is smaller than the diameter of the connecting hole.

* * * * *

UNITED STATES PATENT AND TRADEMARK OFFICE
CERTIFICATE OF CORRECTION

PATENT NO. : 6,923,678 B2
DATED : August 2, 2005
INVENTOR(S) : Yoshiaki Kato et al.

It is certified that error appears in the above-identified patent and that said Letters Patent is hereby corrected as shown below:

Column 7,
Line 9, delete "claim 14", and insert therefor -- claim 11 --.

Signed and Sealed this

Twenty-seventh Day of September, 2005

JON W. DUDAS
*Director of the United States Patent and Trademark Office*

UNITED STATES PATENT AND TRADEMARK OFFICE
CERTIFICATE OF CORRECTION

PATENT NO. : 6,923,678 B2
DATED : August 2, 2006
INVENTOR(S) : Yoshiaki Kato et al.

It is certified that error appears in the above-identified patent and that said Letters Patent is hereby corrected as shown below:

Title page,
Item [73], Assignee, delete "Selsakusho" and insert -- Seisakusho --.

Signed and Sealed this

Eleventh Day of April, 2006

JON W. DUDAS
*Director of the United States Patent and Trademark Office*

UNITED STATES PATENT AND TRADEMARK OFFICE
CERTIFICATE OF CORRECTION

PATENT NO. : 6,923,678 B2
DATED : August 2, 2005
INVENTOR(S) : Yoshiaki Kato et al.

It is certified that error appears in the above-identified patent and that said Letters Patent is hereby corrected as shown below:

<u>Title page,</u>
Item [73], Assignee, delete "Selsakusho" and insert -- Seisakusho --.

This certificate supersedes Certificate of Correction issued April 11, 2006.

Signed and Sealed this

Second Day of May, 2006

JON W. DUDAS
*Director of the United States Patent and Trademark Office*